United States Patent [19]

Goto

[11] Patent Number: 5,012,344
[45] Date of Patent: Apr. 30, 1991

[54] SOLID-STATE IMAGE PICKUP DEVICE HAVING SHARED OUTPUT LINE FOR PHOTOELECTRIC CONVERSION VOLTAGE

[75] Inventor: Hiroshige Goto, Yokohama, Japan

[73] Assignee: Kabushiki Kaisha Toshiba, Kawasaki, Japan

[21] Appl. No.: 385,159

[22] Filed: Jul. 26, 1989

[30] Foreign Application Priority Data

Jul. 26, 1988 [JP] Japan .................. 63-186366
Nov. 4, 1988 [JP] Japan .................. 63-279105

[51] Int. Cl.⁵ .................................... H04N 3/14
[52] U.S. Cl. ..................... 358/213.11; 358/213.23
[58] Field of Search ............... 358/213.11, 213.22, 358/213.29, 909, 482, 483

[56] References Cited

U.S. PATENT DOCUMENTS

| 4,617,471 | 10/1986 | Suzuki et al. | 358/213.11 |
| 4,763,007 | 8/1988 | Takahashi | 358/213.11 |
| 4,868,405 | 9/1989 | Nakamura | 358/213.11 |

FOREIGN PATENT DOCUMENTS

| 48-26485 | 4/1973 | Japan . |
| 49-69011 | 7/1974 | Japan . |
| 50-134393 | 10/1975 | Japan . |
| 52-73636 | 6/1977 | Japan . |
| 53-43416 | 4/1978 | Japan . |

Primary Examiner—Stephen Brinich
Attorney, Agent, or Firm—Foley & Lardner

[57] ABSTRACT

A semiconductor substrate is formed by integrating, on a semiconductor substrate, a plurality of photosensitive pixels producing signal charges corresponding to a quantity of an incident light. A shift register responsive to a pulse input from the external generates a predetermined control pulse. A plurality of charge/voltage conversion elements are provided in correspondence with the plurality of photosensitive pixels, respectively, and an element-shared output line is provided for the external output of the plurality of charge/voltage conversion elements. The charge/voltage conversion elements respond to a predetermined control pulse generated from the shift register to detect quantities of integration of signal charges generated from corresponding photosensitive pixels and zero reference levels of the quantity of integration, to convert these detected values into voltages to sequentially output them to the element-shared output line.

8 Claims, 9 Drawing Sheets

SOLID-STATE IMAGE PICKUP DEVICE HAVING SHARED OUTPUT LINE FOR PHOTOELECTRIC CONVERSION VOLTAGE

BACKGROUND OF THE INVENTION

This invention relates to a solid-state image pickup device.

For the linear image sensor, CCD linear image sensors, image sensors of the contact type using amorphous silicon and the like, have been conventionally used.

In the case of the above-described CCD sensors, since readout of signals is carried out typically using a CCD analog shift register, they had the problem that the manufacturing process was complicated and they were expensive.

On the other hand, in the case of image sensors of the contact type using amorphous silicon, since an output is obtained in the form of a light current, they had the problems that it was required to externally provide a suitable integrator, and that a sufficient signal-to-noise (SN) ratio could not be obtained.

SUMMARY OF THE INVENTION

This invention has been made in view of the above-mentioned problems, and its object is to provide a solid-state image pickup device which has a simple manufacturing process, and which is capable of providing a sufficient SN ratio.

A solid-state image pickup device according to this invention in which a plurality of photosensitive pixels producing signal charges corresponding to a quantity of an incident light, a shift register responsive to a pulse input from the external to generate a predetermined control pulse, a plurality of charge/voltage conversion elements provided in correspondence with the plurality of photosensitive pixels, respectively, and a shared output line for outputting, to the external, outputs from the plurality of charge/voltage conversion elements, are integrated on a semiconductor substrate, wherein the charge/voltage conversion elements respond to the predetermined control pulse generated from the shift register to detect quantities of integration of signal charges generated from corresponding photosensitive pixels and reference levels of the quantity of integration to convert these values detected to voltages, to therefore output them sequentially to the shared output line.

In accordance with the solid-state image pickup device according to this invention thus constructed, since readout of signal charges is conducted in accordance with a predetermined control pulse, e.g., the formation of multilayer polysilicon becomes unnecessary, so the manufacturing process is simplified, unlike the case of conventional CCD sensors. Moreover, this device adopts such a scheme to detect quantities of integration of signal charges and zero reference levels of the quantity of integration by the charge/voltage conversion elements to convert the values detected to a corresponding voltage values, to therefore sequentially output them to the outside through the shared output line. This permits execution of processing, e.g., correlative double sampling, etc., resulting in a sufficient SN ratio.

As just described above, in accordance with the solid-state image pickup device according to this invention, the manufacturing process is simple and a sufficient SN ratio can be obtained.

DETAILED DESCRIPTION OF THE PREFERRED EMBODIMENTS

Figure 1:
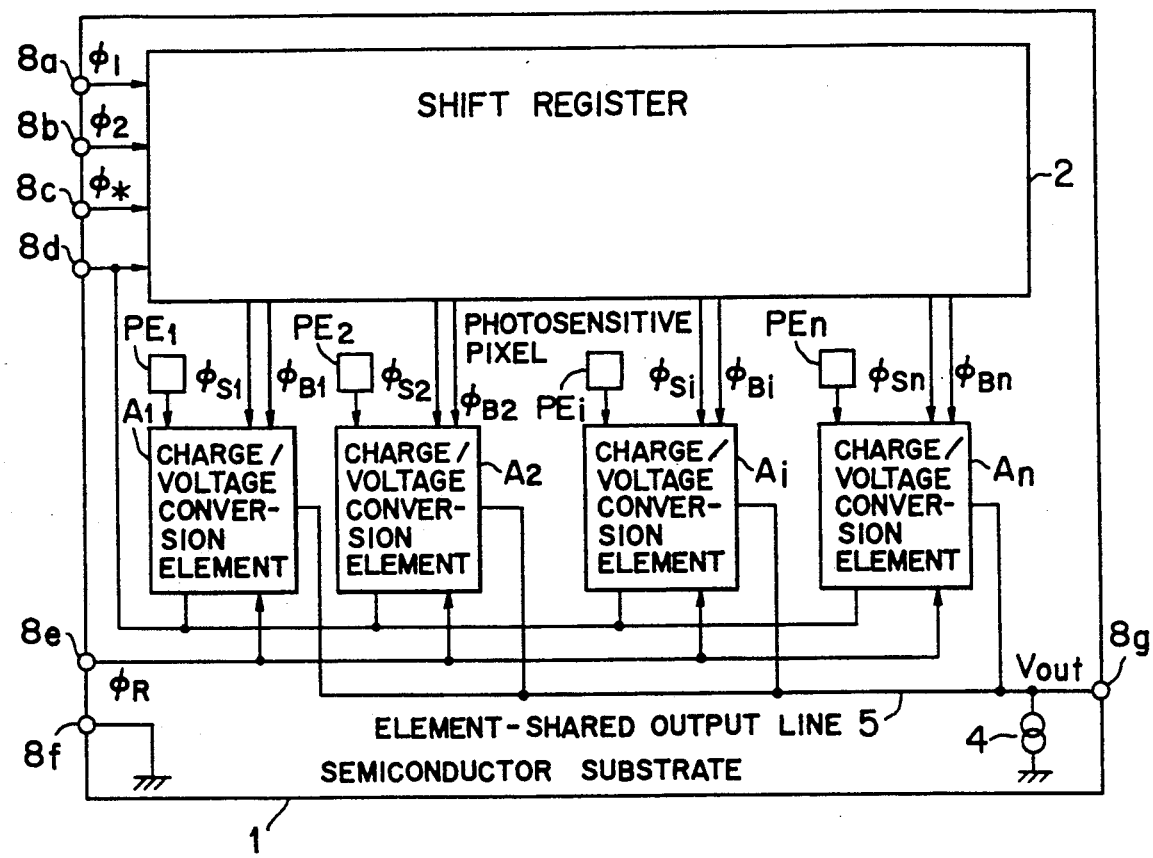
FIG. 1 is a block diagram showing the schematic configuration of a solid-state image pickup device according to this invention.

Embodiments of this invention will be described with reference to the attached drawings. Referring to FIG. 1, there is shown a fundamental configuration of a solid-state image pickup device according to this invention. On a semiconductor substrate designated by reference numeral 1, a shift register 2, photosensitive pixels $PE_1$, ... $PE_n$, charge/voltage conversion elements $A_1$, ..., $A_n$, a Current source 4, and an element-shared output line 5 are integrated. The semiconductor substrate 1 is provided with terminals 8a, 8b, 8c, 8d, 8e, 8f and 8g. To the shift register 2, drive pulse $\phi_1$ and $\phi_2$ are steadily applied from the external through terminals 8a and 8b, respectively. Furthermore, a start pulse $\phi*$ is applied to the shift register 2 through terminal 8c, and a d.c. voltage (e.g., 5V or 12V) is applied to the shift register 2 and to charge/voltage conversion elements $A_1$, ..., $A_n$ through terminal 8d. Furthermore, a reset pulse $\phi_R$ input through terminal 8e is applied to charge/voltage conversion elements $A_1$, ..., $A_n$. The terminal designated by reference numeral 8f serves as a ground terminal.

On the basis of the fundamental configuration as mentioned above, a first embodiment of this invention is explained in accordance with the detailed circuitry and function of the image pickup device shown in FIGS. 2 to 6.

Figure 2:
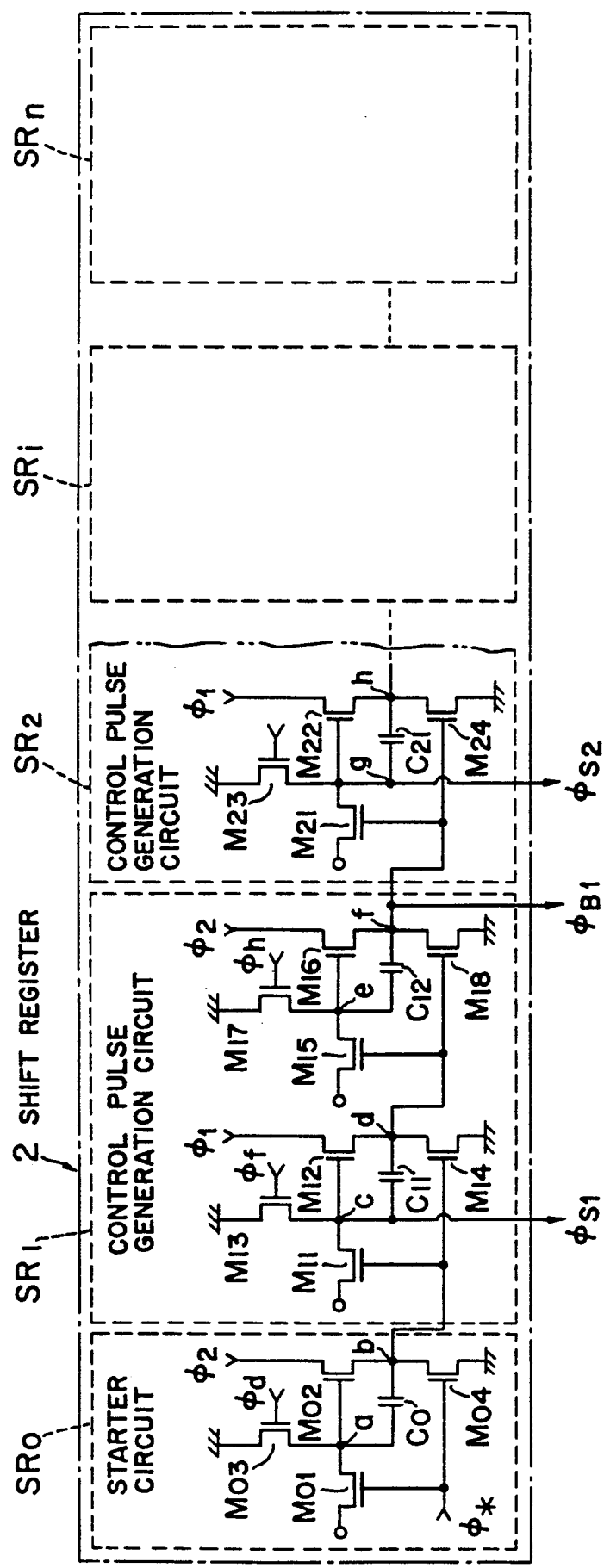
FIG. 2 is a circuit diagram showing the configuration of a shift register used in the solid-state image pickup device according to a first embodiment of this invention.

At first, the shift register 2 responds to drive pulses $\phi_1$ and $\phi_2$ and start pulse $\phi*$ to generate control pulses $\phi_{si}$ and $\phi_{Bi}$ (i=1, 2, ..., n) to output them to a charge/voltage conversion element $A_i$. An actual example of the shift register 2 constructed so that it generates control pulses $\phi_{Si}$ and $\phi_{Bi}$ (i=1, 2, ..., n) on the basis of drive pulses $\phi_1$ and $\phi_2$ and start pulse $\phi\bullet$ in this way is shown in FIG. 2. As shown in this figure, the shift register 2 is composed of a starter circuit $SR_0$ and an n number of control pulse generation circuits $SR_1$, ... $SR_n$. More particularly, the starter circuit $SR_0$ is composed of four MOS transistors (hereinafter simply referred to as transistors, respectively) $M_{01}, ..., M_{04}$, and one capacitor $C_0$, and the control pulse generation circuit $SR_i$ (i=1, 2, ..., n) is each composed of eight MOS transistors, for example, transistors $M_{11}$, $M_{18}$ and two capacitors $C_{11}$ and $C_{12}$ in the circuit $SR_1$ in FIG. 2.

It is to be noted that an indication of four MOS transistors $M_{25}$, $M_{26}$, $M_{27}$ and $M_{28}$ and capacitor $C_{22}$ in the control pulse generation circuit is omitted.

The operation of the starter circuit $SR_0$ and the control pulse generation circuit $SR_i$ will now be described with reference to FIG. 3.

Figure 3:
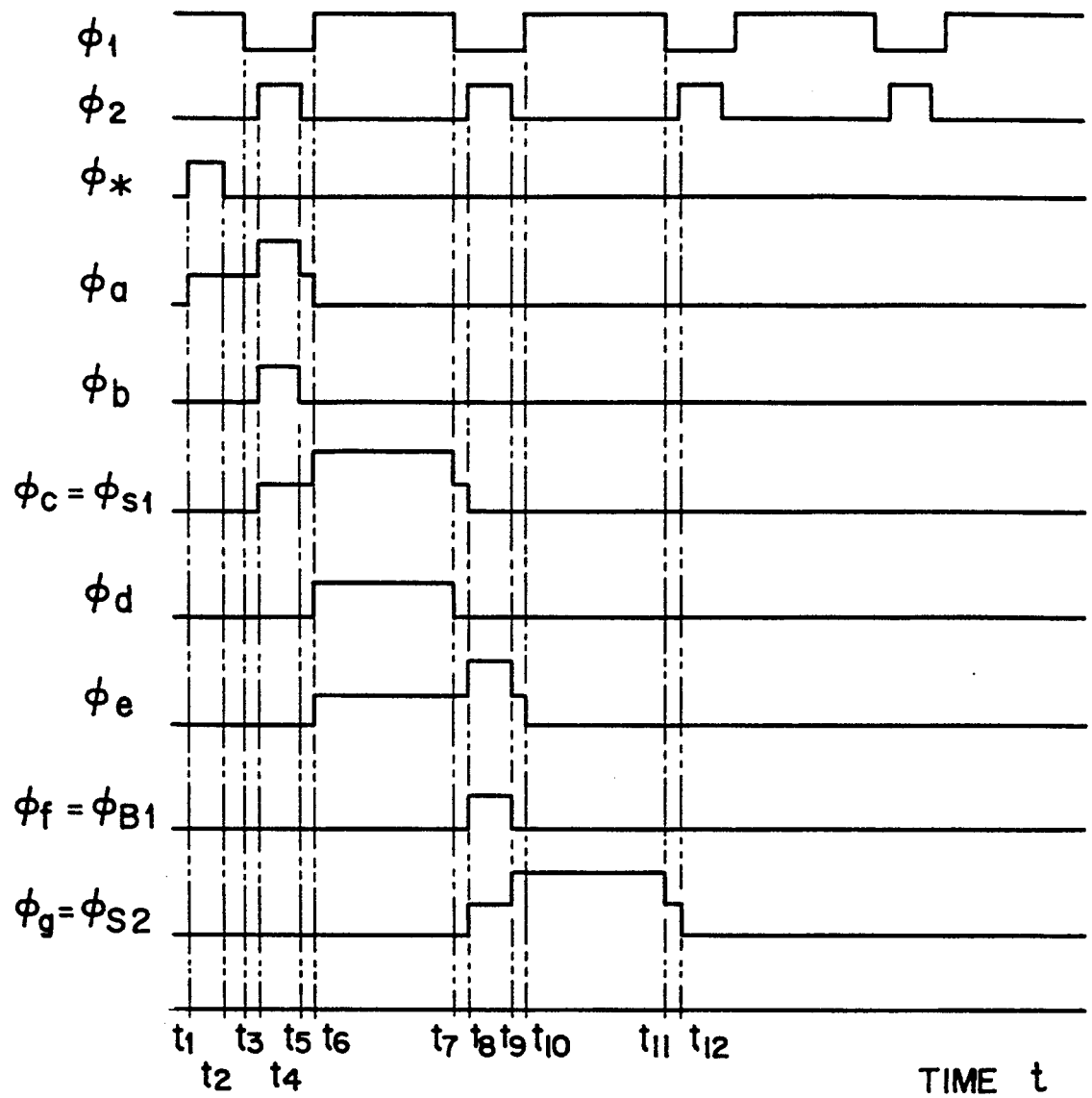
FIG. 3 is a timing chart for explaining the operation of the shift register shown in FIG. 2.

It is assumed that when drive pulses $\phi_1$ and $\phi_2$ shown in FIG. 3 are applied to the shift register 2, a start pulse $\phi\bullet$ is applied at time of $t_1$. A d.c. voltage of 5V is applied to the source side of the MOS transistor $M_{01}$ of the starter circuit $SR_0$ through the terminal $8d$ shown in FIG. 1. When start pulse $\phi\bullet$ is applied to the gate of the MOS transistor $M_{01}$ at time $t_1$, a potential $\phi_a$ on the point a on the drain side of the transistor $M_{01}$ is raised from low level to reach a value less than 5V. When the start pulse $\phi\bullet$ shifts from high level to low level at time $t_2$, the potential $\phi_a$ on the point remains at a value less than 5V by the influence of the capacitor $C_0$. This potential $\phi_a$ is applied to the gate of the transistor $M_{02}$. However, since the drive pulse $\phi_2$ is at low level, the potential $\phi_b$ on the point b is also at low level. Such a state is continued until the drive pulse $\phi_2$ shifts from low to high level at time $t_4$.

When the drive pulse $\phi_2$ shifts from low to high level at time $t_4$, the potential $\phi_b$ on the point b is raised. Accordingly, the potential $\phi_a$ on the point a is raised by the step-up action to reach a value less than 5V as shown in FIG. 3. Such a state is continued until time $t_5$. Since the drive pulse $\phi_2$ shifts from high to low level at time $t_5$, the potential $\phi_b$ on the point b also shifts from high to low level. Accordingly, the potential $\phi_a$ on the point a is also lowered from a value larger than 5V to a value lower than 5V.

On the other hand, a d.c. voltage of 5V is applied through terminal $8d$ shown in FIG. 1 to the source side of the transistor $M_{11}$ of the control pulse generation circuit $SR_1$. Since the potential $\phi_b$ is applied to the gate of the transistor $M_{11}$, a potential $\phi_c$ on the point c on the drain side of the transistor $M_{11}$ is raised from low level to a value lower than 5V in the same manner as in the case of the potential $\phi_a$ on the point of the start circuit $SR_0$. Such a state is continued until the time $t_6$ when the drive pulse applied to the source side of the transistor $M_{12}$ shifts from low to high level. Since the potential $\phi_c$ is applied to the gate of the transistor $M_{12}$ and the drive pulse $\phi_1$ shifts from low to high level at time $t_6$, a potential $\phi_d$ on the point d is raised. Accordingly, the potential $\phi_c$ on the point c is also raised by the step-up action to reach a value larger than 5V. Such a state is continued until $t_7$ when the drive pulse $\phi_1$ shifts from high to low level.

Since the potential $\phi_d$ shifts from low to high level at time $t_6$, the gate of the transistor $M_{03}$ of the start circuit $SR_0$ to which the potential $\phi_d$ is applied is opened at time $t_6$. As a result, the potential $\phi_a$ on the point a shifts to low level.

When the drive pulse $\phi_1$ shifts from high to low level at time $t_7$, the potential $\phi_d$ on the point d also shifts from high to low level. Accordingly, the potential $\phi_c$ on the point c is also lowered from a value larger than 5V to a value smaller than 5V.

On the other hand, a d.c. voltage of 5V is applied through the terminal $8d$ shown in FIG. 1 to the source side of the transistor $M_{15}$ of the control pulse generation circuit $SR_1$, and the potential $\phi_d$ is applied to the gate of the transistor $M_{15}$. As a result, a potential $\phi_e$ on the point e on the drain side of the transistor $M_{15}$ is raised from low level to a value larger than 5V. Such a state is continued until $t_8$ when the drive pulse $\phi_2$ applied to the source side of the transistor $M_{16}$ shifts from low to high level. Since the potential $\phi_e$ is applied to the gate of the transistor $M_{16}$ and the drive pulse $\phi_2$ shifts from low to high level at time $t_8$, a potential $\phi_f$ on the point f is raised. Accordingly, the potential $\phi_e$ on the point is also raised by the step-up action. Such a state is continued until time $t_9$ when the drive pulse $\phi_2$ shifts from high to low level.

Since the potential $\phi_f$ on the point f shifts from low to high level at time $t_8$, the gate of the transistor $M_{13}$ to which the potential $\phi_f$ is applied is opened at time $t_8$. As a result, the potential $\phi_c$ on the point c shifts to low level. Then, these potentials $\phi_c$ and $\phi_f$ are taken out from the control pulse generation circuit $SR_1$ as control pulses $\phi_{S1}$ and $\phi_{B1}$, respectively. These control pulses thus taken out, are output to the voltage/charge conversion element $A_1$.

The potential $\phi_f$ is applied from the control pulse generation circuit $SR_1$ to the gate of the transistor $M_{21}$ of the control pulse generation circuit $SR_2$. Thus, control pulses $\phi_{S2}$ and $\phi_{B2}$ are taken out from the control pulse generation circuit $SR_2$ in the same manner as in the case of the control pulse generation circuit $SR_1$. These pulses thus taken out are output to the charge/voltage conversion element $A_2$. By repeatedly carrying out such an operation in sequence, control pulses $\phi_{Si}$ and $\phi_{Si}$ are taken out from a control pulse generation circuit $SR_i$ (i=1, ..., n). These control pulses thus taken out, are output to the corresponding charge/voltage conversion element $A_i$.

It is to be noted that the control pulse $\phi_{Si}$ is a trinary pulse as shown in FIG. 3, and its maximum level is larger than the power supply voltage (5V).

Referring again to FIG. 1, the charge/voltage conversion element Ai (i=1, ..., n) responds to control pulse $\phi_{Si}$ and $\phi_{Ri}$ and reset pulse $\phi_R$ applied through terminal $8e$ to detect a quantity of integration of signal charges generated by the photosensitive pixel $PE_i$ and a zero reference level of the quantity of integration to convert these values detected to a voltage, thus to specifically output the voltage to the element-shared output line 5. The output $V_{out}$ of the charge/voltage conversion element $A_i$ specifically output to the common line 5 is output to the external through the terminal $8g$.

Figure 4:
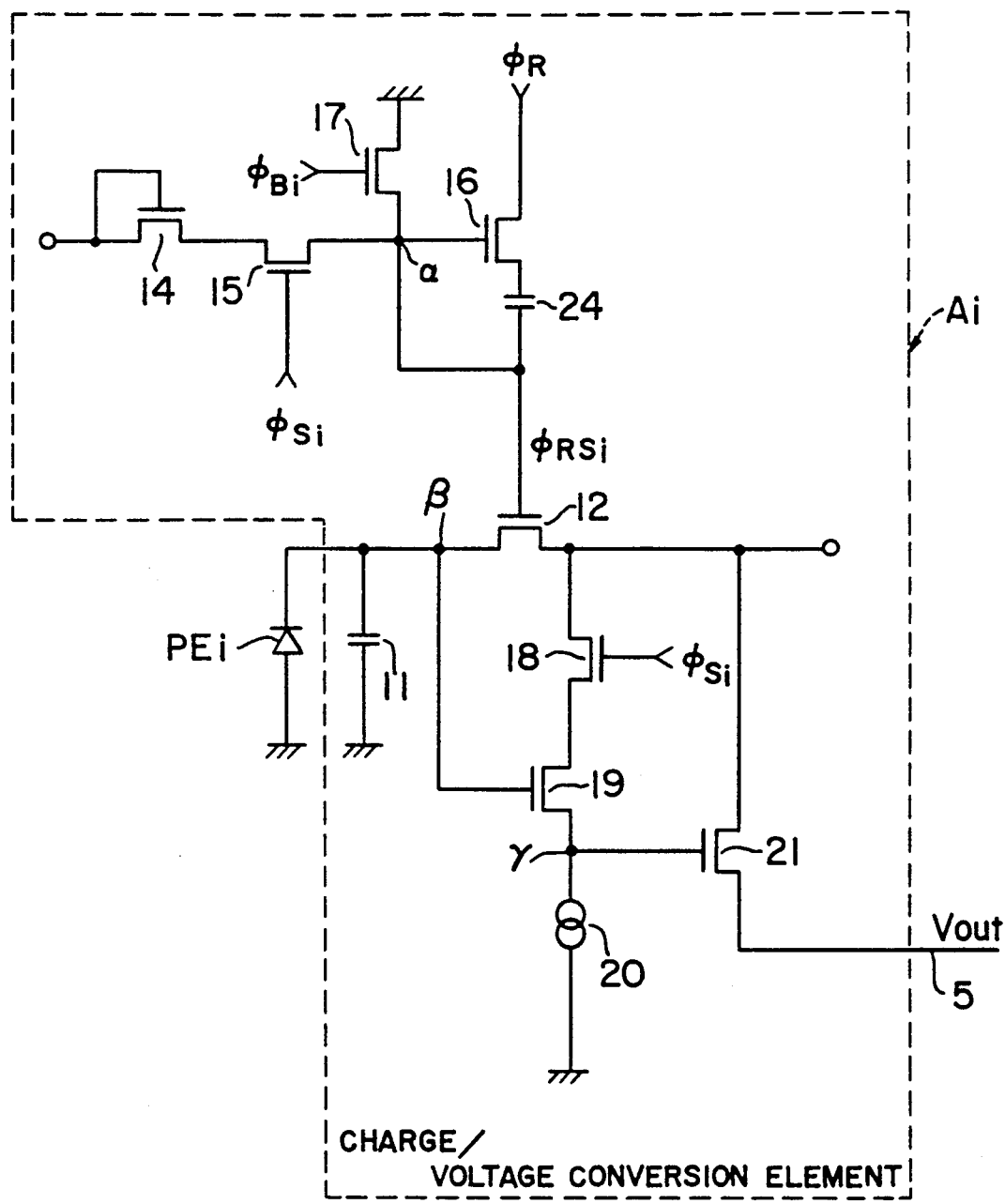
FIG. 4 is a circuit diagram showing the circuit configuration of a charge/voltage conversion element used in the solid-state image pickup device according to the first embodiment of this invention.

An actual example of such a charge/voltage conversion element $A_i$ is shown in FIG. 4. The circuit configuration shown in this figure includes a capacitor 11 for storing signal charges generated in a photosensitive pixel (e.g., a photodiode) $PE_i$, a reset transistor 12, MOS transistors (hereinafter simply referred to as transistors) 14 to 19, a current source 20, a driver gate 21, and a step-up capacitor 24.

As shown in FIG. 4, the control pulse $\phi_{Si}$ is applied to the gates of transistors 15 and 18, and the control pulse $\phi_{Bi}$ is applied to the gate of the transistor 17. In addition, the reset pulse $\phi_R$ is applied to the source of the transistor 16.

Figure 5:
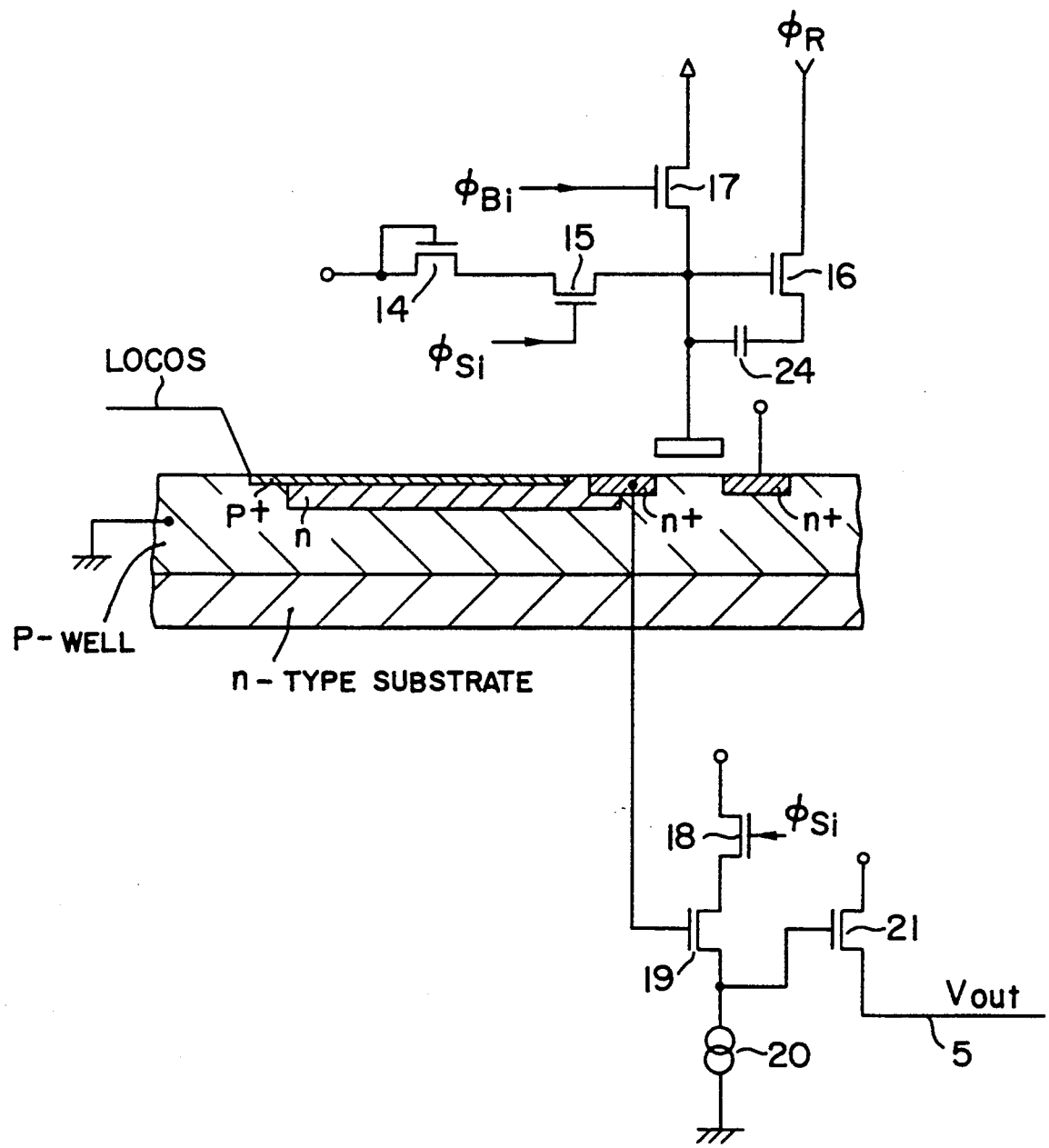
FIG. 5 is a schematic diagram showing the structure of a photosensitive pixel used in the solid-state image pickup device according to this invention.

It is to be noted that the photodiode $PE_i$ is constituted, e.g., as shown in FIG. 5, by forming a P-well on an N type semiconductor substrate to form an n type semiconductor substrate to form an n region and a P+ region on the side of the surface of the P-well. In FIG. 5, LOCOS represents a selective oxidation structure of the silicon substrate by a silicon nitride film and is an abbreviation of localized oxidation of silicon.

Further, two n+ regions are separately formed on the side of the surface of the P-well, and one n+ region thereof is in contact with the n region. The n+ region and an electrode formed between two n+ regions constitute the above-mentioned reset transistor 12.

Figure 6:
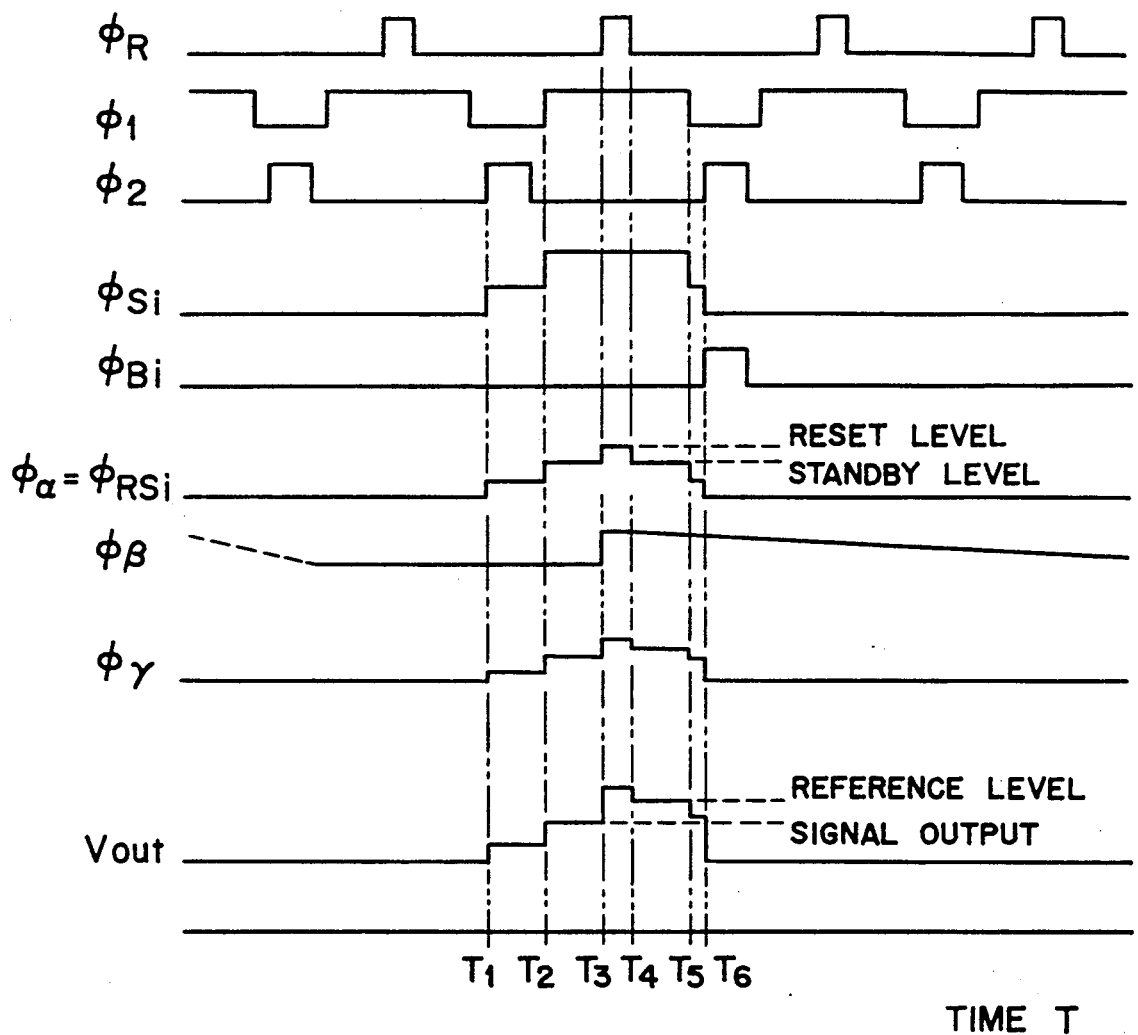
FIG. 6 is a timing chart for explaining the operation of the first embodiment of a charge/voltage conversion element used in the solid-state image pickup device according to this invention.

Next, the operation of the device according to the first embodiment will be explained with reference to FIG. 4 and a characteristics diagram shown in FIG. 6.

A d.c. voltage of 5V is applied to the source and the gate of the transistor 14 through the terminal 8d shown in FIG. 1 (see FIG. 4). When the control pulse $\phi_{Si}$ is applied to the gate of the transistor 15 at time $T_1$, a potential $\phi_\alpha$ on the point $\alpha$ shown in FIG. 4 is slightly raised from low level to reach a predetermined level (see FIG. 6). Since the control pulse $\phi_{Si}$ shifts to high level at time $T_2$, the potential $\phi_\alpha$ shifts to a standby level. Since the reset pulse $\phi_R$ shifts from low to high level at time $T_3$, the potential $\phi_\alpha$ the point $\alpha$ is raised by the step-up action to reach a predetermined level (hereinafter referred to as a reset level). Since the reset pulse $\phi_R$ shifts from high to low level at time $T_4$, the potential $\phi_\alpha$ shifts to the standby level for a second time. This standby level is continued until $T_5$.

As stated above, the pulse $\phi_{RSi}$ ($=\phi_\alpha$) applied to the gate of the reset transistor 12 becomes a quarternary pulse. For a time period during which the pulse $\phi_{RSi}$ is at standby level, the capacitor 11 holds signal charges without being reset by the reset transistor 12. The capacitor 11 is reset at time $T_3$ when the pulse $\phi_{RSi}$ shifts to reset level. This reset state is continued until $T_4$. Thereafter, the potential $\phi_\beta$ on the point $\beta$ shown in FIG. 4 is lowered accordingly as signal charges from the photodiode $PE_i$ are stored into the capacitor 11.

When the control pulse $\phi_{Si}$ is at the maximum level (from $T_2$ to $T_5$), the transistor 19 becomes active as a source-follower circuit. For a time period during which the pulse $\phi_{RSi}$ is at the standby level and the control pulse $\phi_{Si}$ is at the maximum level (from $T_2$ to $T_3$), a potential $\phi_\gamma$ corresponding to a quantity of signal charges stored in the capacitor 11 after the last reset operation until $T_2$ is detected at the source follower circuit. For a time period during which the pulse $\phi_{RSi}$ is at reset level and the control pulse $\phi_{Si}$ is at the maximum level (from $t_3$ to $t_4$), the potential $\phi_\beta$ across the capacitor 11 is reset. Furthermore, for a time period during which the pulse $\phi_{RSi}$ is at the standby level and the control pulse $\phi_{Si}$ is at the maximum level (from $T_4$ to $T_5$), a potential across the capacitor 11 where there is little signal charge at the time when signal charges flows thereinto from the photodiode $PE_i$ after reset. The level at this time can be considered as a zero reference for signal charges.

The potential $\phi_\gamma$ thus detected is amplified by the driver gate 21 and is output to the shared output line 5. It is to be noted that the potential $\phi_\gamma$ on the point $\gamma$ is equal to zero before the control pulse $\phi_{Si}$ is applied to the gate of the transistor 18, and this potential $\phi_\gamma$ is applied to the driver gate 21, the shared output line 5 is not affected by the potential on the point $\gamma$. Furthermore, when the potential $\phi_\gamma$ on the point of the charge/voltage conversion element $A_i$ is not equal to zero, i.e., the control pulse $\phi_{Si}$ is not at the low level, a control pulse $\phi_{Sj}$ applied to other (n−1) charge/voltage conversion elements $A_j$ (j≠i) is at low level. As a result, outputs from other (n−1) charge/voltage conversion elements $A_j$ will be cut off. Accordingly, readout of potentials, i.e., signal charges can be sequentially carried out on the shared output line 5.

As just described above, in accordance with the first embodiment, since readout of signal charges is carried out in accordance with a predetermined control pulse, e.g., formation of a multilayer polysilicon becomes unnecessary, resulting in a simplified manufacturing process, unlike the case of the conventional CCD sensors. Furthermore, quantities of integration of signal charges and zero reference levels of the quantity of integration are converted to voltage values and are sequentially output to the external through the element-shared output line 5. Thus, processing e.g., correlative double sampling, etc. can be performed, resulting in a sufficient SN ratio. In addition, the solid-state image pickup device can be driven by a low voltage of 5V.

Figure 7:
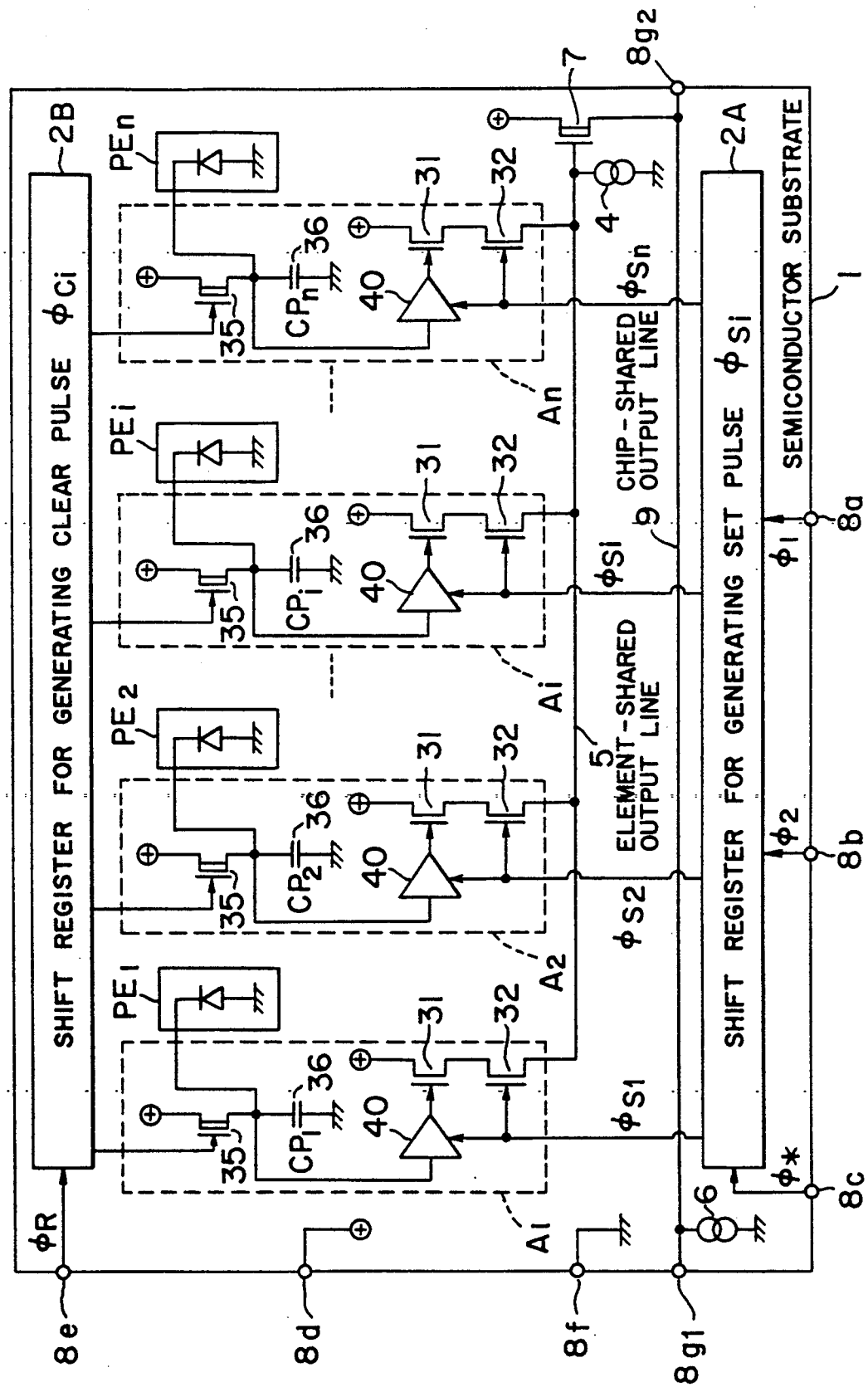
FIG. 7 is a circuit diagram showing the whole configuration of a solid-state image pickup device according to a second embodiment of this invention.
Figure 8:
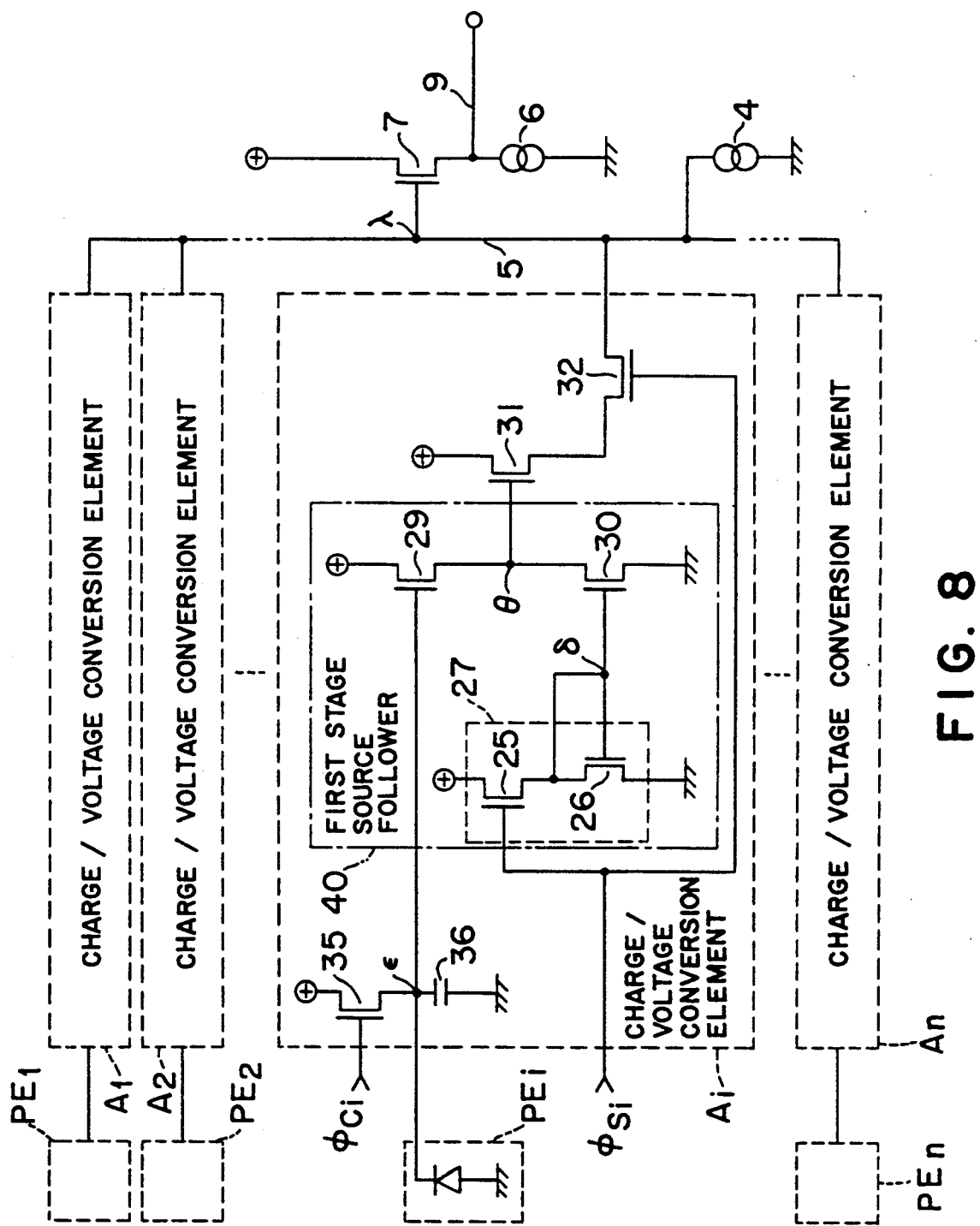
FIG. 8 is a circuit diagram showing the detailed circuitry of a charge/voltage conversion element used in the solid-state image pickup device shown in FIG. 7.
Figure 9:
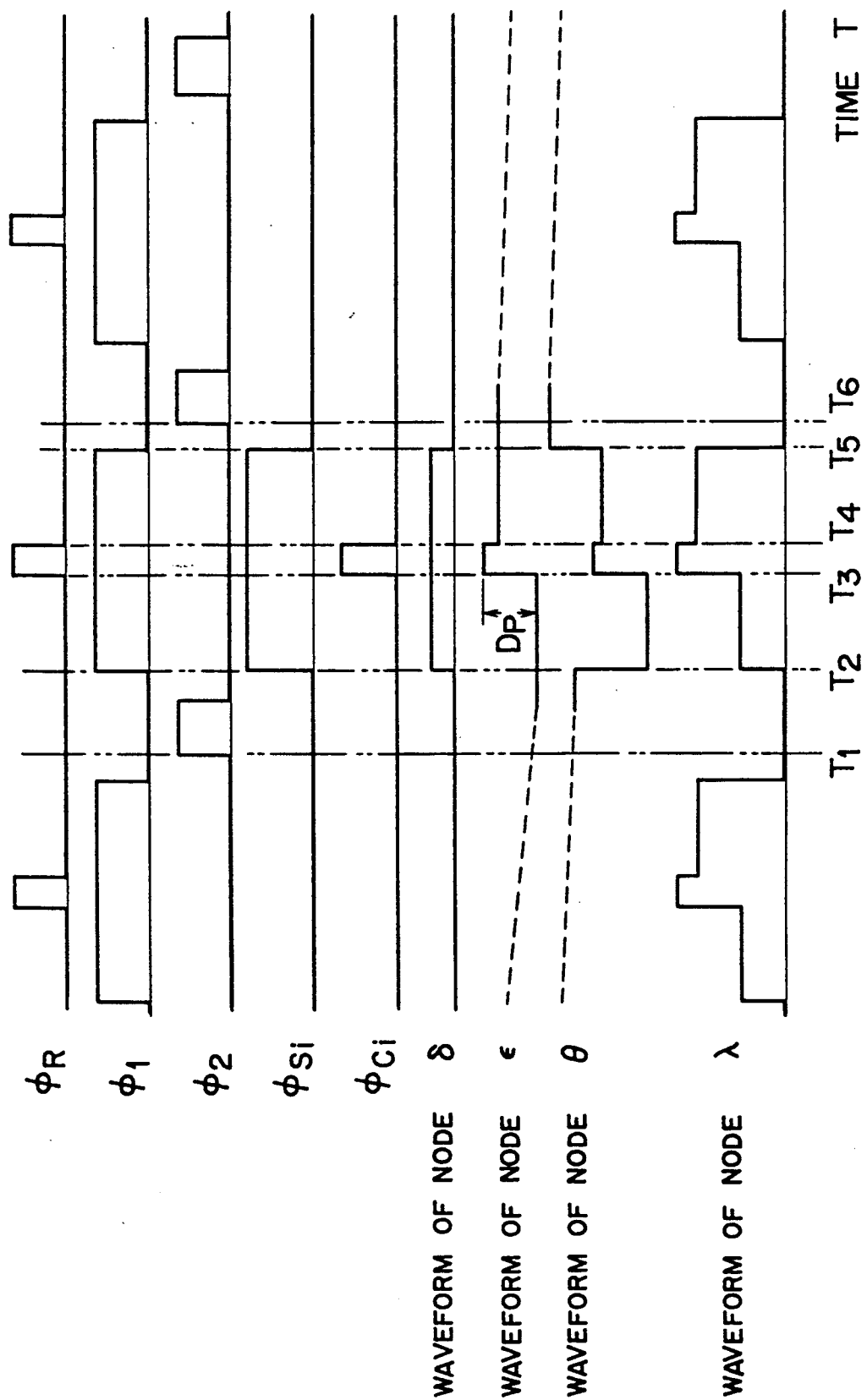
FIG. 9 is a timing chart showing pulse waveforms of each node shown in FIG. 8 for explaining the operation of the image pickup device according to the second embodiment of this invention.

Though the solid-state image pickup device according to the first embodiment comprises the charge/voltage conversion element having the circuitry shown in FIG. 4 and driven by the control pulse of 5V, the device of the present invention is not restricted in the first embodiment and is applicable to the second embodiment having the configuration and function each shown in FIGS. 7 to 9.

FIG. 7 shows the entire configuration of a solid-state image pickup device according to the second embodiment. As elements having the same numerals of FIGS. 1, 4 and 5 are the same or equivalent elements thereof, duplicate explanation will be omitted.

The second embodiment is different from the first embodiment having the conversion element shown in FIG. 4 at two points hereinafter. The first is when the image pickup device is formed in a chip, the capacitors for raising the voltage occupy large areas within a chip. On the contrary, the conversion element according to the second embodiment does not have capacitors for raising the voltage, and so the chip of a device can be integrated higher. Next, though the concept was already created in the first embodiment, it is possible for the second embodiment to form a solid-state image sensor into a multichip circuit in which a plurality of chips are interconnected with each other after each chip of the image pickup device is completed on the semiconductor substrate 1. Therefore, a chip-shared output line 9 is provided for interconnecting the chips in each chip. However, a conversion element $A_i$ of the second embodiment is driven by a 12V control voltage different to the 5V of the first embodiment.

At first, the entire configuration of the image pickup device according to the second embodiment is described with reference to FIG. 7. The chip-shared line 9 for interconnecting chips and achieving a multichip, has in both ends an input terminal $8g_1$ having a current source 6, and an output terminal $8g_2$ to which the element-shared output line 5 is connected through a buffer 7. The buffer 7 is provided for output voltage of the element-shared line 5 to the chip-shared line 9 having the low impedance. The current source 6 and buffer 7 form a source follower circuit.

A pixel $PE_i$ (i=1, 2, ..., n) comprised of diodes and the like is connected to a corresponding charge/voltage conversion element $A_i$ (i=1, 2, ..., n). The element $A_i$ functions for potential detection and output of the pixel $PE_i$. Namely, the electric charges of the pixel $PE_i$ flowing in a capacitor 36 ($CP_i$) are charged therein and then, two-stage source followers read out the change of potential between both ends of the capacitor 36 $CP_i$). After reading out the potential change, a reset pulse $\phi_R$ impressed from the outside resets and equalizes the potential of both ends of the capacitor 36 ($CP_i$) to an external power source ⊕. The two-stage source followers comprise a first stage source follower 40 which is controlled in operation by a set pulse $\phi_{Si}$, and a second stage source follower which is controlled by the first stage source follower 40. The second stage source follower concretely comprises the current source 4 and driver 31. A numeral 32 denotes a gate for selecting the conversion element and then, while the gate 32 opens by the set pulse $\phi_{Si}$ and output of the driver 31, the conversion element having the open gate 32 outputs a converted voltage to the element-shared output line 5.

In the second embodiment, a shift register comprises a first shift register 2A for generating a set pulse $\phi_{Si}$, and a second shift register 2B for generating a clear pulse $\phi_{Ci}$ which is made in each chip on the basis of the reset pulse $\phi_R$ supplied from the outside. The external power source ⊕ is supplied the terminal 8d of the chip in the same manner as the first embodiment.

Next, there will be explained the detailed configuration of the charge/voltage conversion element $A_i$ formed on the semiconductor substrate 1 corresponding to the pixel $PE_i$ with reference to FIG. 8. In the figure, the first stage source follower 40 is designated in detail.

In FIG. 8, the first stage source follower 40 comprises MOS (metal oxide semiconductor) transistors 25 and 26 forming a voltage divider circuit 27 which generates a load-bias voltage in response to the set pulse $\phi_{Si}$, a driver 29 to which the voltage of the capacitor 36 is impressed, and a current source 30 to which the voltage divided by the divider 27 is impressed.

The operation of the image pickup device according to the second embodiment is described in detail with reference to FIG. 9 which shows pulse waveforms of nodes $\delta$, $\epsilon$ and $\theta$ of the conversion element $A_i$ and output waveform of node $\lambda$ of the element-shared output line 5 in addition to FIG. 8.

When the first stage source follower 40 receives the set pulse $\phi_{Si}$ generated in the first shift register 2A, the voltage divider circuit 27 generates a load-bias voltage. The load-bias voltage which appears at the node $\delta$ synchronous with the set pulse $\phi_{Si}$ supply, as shown in FIG. 9, is output between times $T_2$ to $T_5$ with 3 to 5V against 12V of set pulse $\phi_{Si}$ as the driving voltage. Namely, the voltage of the node $\delta$ raises at the time $T_2$ and falls at the time $T_5$ synchronous with the set pulse $\phi_{Si}$. At this time, the potential difference Dp occurs at the node $\epsilon$ according to quantity of light sensed by the pixel $PE_i$ before and after the clear pulse $\phi_{Ci}$ generated in each element $A_i$ in response to the reset pulse $\phi_R$.

The output of the first stage source follower 40 is determined by both waveforms of the nodes $\delta$ and $\epsilon$. Accordingly, the pulse waveform of the node $\theta$ between the driver 29 and current source 30, as shown in FIG. 9, falls gradually until time $T_2$ and abruptly at time $T_2$. At time $T_3$, the voltage of the node raises with an amount of the potential difference Dp corresponding to the quantity of light sensed by pixel $PE_i$, and falls at time $T_4$. After the waveform of the node falls gradually between times $T_4$ and $T_5$, raises again at the time $T_5$, and falls gradually after the time $T_5$. Thus, the waveform of node $\theta$ is controlled in the offset and impedance on the basis of waveforms of the nodes $\delta$ and $\epsilon$.

The output of the first stage source follower 40 mentioned above, namely the waveform of the node $\theta$, is output to the element-shared line 5 through the driver 31 and selection gate 32. The element-shared line 5 is sequentially supplied with the outputs of each element $A_i$, that is, elements $A_1$ to $A_n$. Accordingly, the waveform of node $\theta$ between times $T_2$ to $T_5$ is repeatedly output to the node $\lambda$ of the shared line 5 every time the driving pulse of the shift register 2 is raised, so that output pulses can be read out in response to the quantity of light sensed by the pixel $PE_i$.

As described above, the outputs of each element $A_i$ (i=1, 2, ..., n) are output to the node $\lambda$ in time series, so that the output of the element $A_i$ supplied the set pulse $\phi_{Si}$ can be sequentially (in time series) read out between times $T_2$ to $T_5$.

In the second embodiment, times $T_1$ and $T_6$ which are the adjacent raising times of the driving pulse $\phi_2$, do not relate directly to the output pulses of the node $\lambda$ because the element $A_i$ of the second embodiment does not operate for raising the voltage.

There are some following effects peculiar to the second embodiment mentioned above. At first, as the chip-shared line 9 for successively connecting chips one by one is formed in each chip, it is possible to form a multichip image pickup device in which a plurality of single chips are successively interconnected from the first to the n-th chips in the manner that an input terminal $8g_1$ of the first chip is bonded to the substrate 1, an output terminal $8g_2$ of the first chip is connected to an input terminal $8g_1$ of the second chip, and an output terminal $8g_2$ of the n-th chip is connected to a terminal of a processing unit.

Next, as the capacitor for raising voltage is eliminated from a chip, it is possible for a chip to have large-scale integration. At the same time, as an impedance of a chip is reduced, it is possible to perform the converting operation rapidly in each chip.

As understood from the foregoing description, it is needless to say that the solid-state image pickup device according to the second embodiment also provides the same advantages as those with the above-described first embodiment.

What is claimed is:

1. A solid-state image pickup device in which a plurality of photosensitive pixels produce signal charges corresponding to a quantity of an incident light, a shift register responsive to an external pulse input to generate a predetermined control pulse, a plurality of charge/voltage conversion elements provided in correspondence with said plurality of photosensitive pixels, respectively, and an element-shared output line for the external output of said plurality of charge/voltage conversion elements, are integrated on a semiconductor substrate, wherein said charge/voltage conversion elements respond to the predetermined control pulse generated from said shift register to detect quantities of integration of signal charges generated from corresponding photosensitive pixels and reference levels of the quantity of integration to convert these values detected to voltages, to therefore sequentially output them onto said element-shared output line.

2. A solid-state image pickup device as set forth in claim 1, wherein each of said charge/voltage conversion elements comprises a charge storage unit for storing signal charges generated from a corresponding photosensitive pixel, reset pulse generation means responsive to a pulse input from the external and the control pulse output from said shift register to generate a reset pulse, a reset gate provided adjacent to said charge storage unit and responsive to said reset pulse output from said reset pulse generation means to carry out gate opening and closing operation, a reset drain for setting said charge storage unit at a predetermined potential when said reset gate is opened, and a charge detection unit comprising a first driver gate to which a potential of said charge storage unit is applied, a current source connected in series between said first driver gate and a ground terminal, a switch gate for opening/closing a power supply, connected in series between said first driver gate and a power supply terminal, and a second driver gate having one end connected to said power supply terminal and the other end connected to said element-shared output line, a voltage on the connection point of said first driver gate and said current source being applied to said second driver gate.

3. A solid-state image pickup device as set forth in claim 2, wherein one load current source is connected to said element-shared output line and is integrated at the same time on said semiconductor substrate.

4. A solid-state image pickup device as set forth in claim 1, wherein said charge/voltage conversion element comprises a charge storage portion such as a capacitor for storing charges according to quantity of light sensed by said pixel, a first buffer activated by a first control pulse occurring in the inside of said device for outputting the detected potential of said charge storage portion, a second buffer for supplying the output of said first buffer in time series relative to other conversion elements, and a charge reset portion for resetting the charges of said charge storage portion in response to a second control pulse occurring in the inside of said device, and said charge/voltage conversion element is connected with a third buffer connected with an output terminal of a single chip for potential detection of said element-shared output line.

5. A solid-state image pickup device as set forth in claim 4, wherein said first buffer includes a first stage source follower as an activation circuit for sequentially outputting the charges according to the quantity of light sensed by said pixel, and wherein said first stage source follower comprises a voltage divider circuit for dividing the voltage of a set pulse as said first control pulse and generating a load bias voltage for supplying to a load, a metal oxide semiconductor (MOS) element as said load supplied with said bias voltage output from said divider circuit, and a driver gate to which said bias voltage is impressed and from which the potential of said conversion element is output.

6. A solid-state image pickup device as set forth in claim 4, wherein said second buffer comprises a second stage source follower having a driver MOS for controlling the output of the charges within the individual element to said shared output line in response to the output of said first buffer, and a current source connected to said element-shared output line.

7. A solid-state image pickup device as set forth in claim 6, wherein said second buffer further comprises a selection gate for selecting which potential of said conversion element should be output to said element-shared output line.

8. A solid-state image pickup device as set forth in claim 4, integrated on a semiconductor substrate to form one chip, and wherein each chip has a chip-shared output line for successively interconnecting with a plurality of chips each other and an input/output terminal provided with said chip-shared line.

* * * * *